United States Patent
Murakami

(10) Patent No.: US 8,963,624 B2
(45) Date of Patent: Feb. 24, 2015

(54) BOOSTING CIRCUIT

(71) Applicant: Winbond Electronics Corp., Taichung (TW)

(72) Inventor: Hiroki Murakami, Saitama (JP)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 13/966,023

(22) Filed: Aug. 13, 2013

(65) Prior Publication Data

US 2014/0035663 A1   Feb. 6, 2014

Related U.S. Application Data

(62) Division of application No. 13/340,012, filed on Dec. 29, 2011, now abandoned.

(30) Foreign Application Priority Data

Jun. 27, 2011   (JP) ................. 2011-141328

(51) Int. Cl.
*G11C 7/12* (2006.01)
*G05F 1/46* (2006.01)
*H02M 3/07* (2006.01)

(52) U.S. Cl.
CPC .............. *G05F 1/465* (2013.01); *H02M 3/073* (2013.01); *G11C 7/12* (2013.01)
USPC .......................................... 327/536; 327/537

(58) Field of Classification Search
CPC ........... G05F 1/465; G11C 7/12; H02M 3/073
USPC .......................... 327/536, 534, 537
See application file for complete search history.

(56) References Cited

U.S. PATENT DOCUMENTS

| 5,396,114 | A | 3/1995 | Lee et al. |
| 6,297,687 | B1 | 10/2001 | Sugimura |
| 2004/0246044 | A1* | 12/2004 | Myono et al. .................. 327/536 |
| 2010/0309716 | A1 | 12/2010 | Tsukada |
| 2012/0014193 | A1 | 1/2012 | Sakurai et al. |
| 2012/0249225 | A1 | 10/2012 | Suzuki et al. |

FOREIGN PATENT DOCUMENTS

| JP | 2001250381 A | 9/2001 |
| JP | 2004508788 | 3/2004 |
| JP | 2005235315 A | 9/2005 |
| JP | 2010283992 | 12/2010 |

* cited by examiner

*Primary Examiner* — Jung Kim
(74) *Attorney, Agent, or Firm* — Muncy, Geissler, Olds & Lowe, P.C.

(57) ABSTRACT

A boosting circuit, includes an output circuit including a first transmission circuit, transmitting charges of a first boosting node to a first output node according to a first transmission control signal, a detection circuit, detecting the voltage level of the first output node, and a pre-charge circuit pre-charging the first boosting node according a detection signal of the detection circuit; a first pump circuit includes a second transmission circuit, transmitting charges to a second output node according to a second transmission control signal, and a first capacitance unit, coupled to the first boosting node, boosting the voltage level of the first boosting node according to charges transmitted in the second output node; and a control circuit, coupled to the output circuit and the first pump circuit, controls the second transmission control signal according to the voltage level of the first output node.

6 Claims, 11 Drawing Sheets

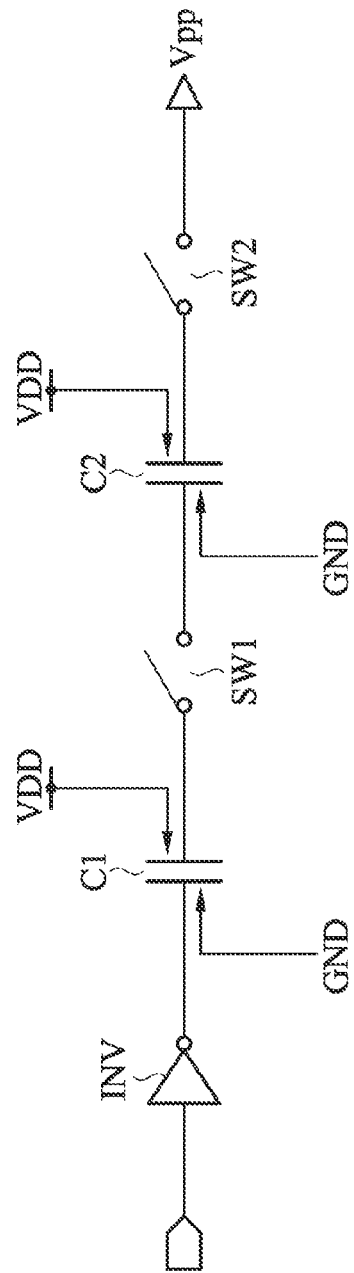
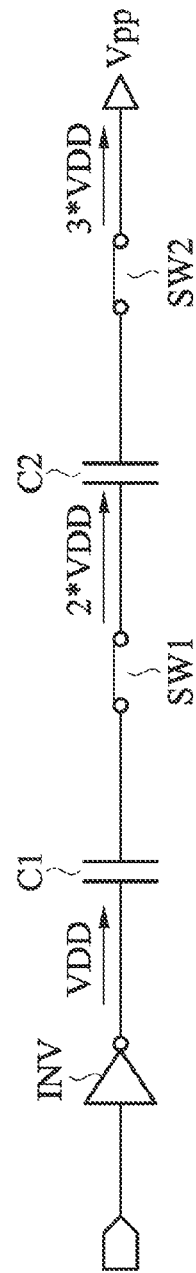
FIG. 1a (PRIOR ART)
FIG. 1b (PRIOR ART)

| Phase | Input | | | Inner | | | Output | | |
|---|---|---|---|---|---|---|---|---|---|
| | Kickb-2 | Kickb-1 | Kickb | Boost-2 | Boost-1 | Kick-2 | Kick-1 | Kick |
| Off | H | H | H | Vdd | Vdd | 0V | 0V | 0V |
| 1 | H | H | L | Vdd | Vdd | 0V | 0V | Vdd |
| 2 | H | L | L | Vdd | 2*Vdd | 0V | Vdd | 2*Vdd |
| 3 | L | L | L | 2*Vdd | 3*Vdd | Vdd | 2*Vdd | 3*Vdd |

Operations of boosting of the invention

FIG. 6

| Phase | Input | | | Inner | | Output | | |
|---|---|---|---|---|---|---|---|---|
| | Kickb-2 | Kickb-1 | Kickb | Boost-2 | Boost-1 | Kick-2 | Kick-1 | Kick |
| Off | H | H | H | Vdd | Vdd | 0V | 0V | 0V |
| 1 | H | H | L | Vdd | Vdd | 0V | 0V | 0.8* Vdd |
| 2 | H | L | L | Vdd | 0.8* Vdd+Vdd | 0V | 0.8* Vdd | 2* (0.8* Vdd) |
| 3 | L | L | L | 0.8* Vdd+Vdd | 2*(0.8* Vdd)+Vdd | 0.8* Vdd | 2* (0.8* Vdd) | 3* (0.8* Vdd) |

Operations of boosting of the conventional art

FIG. 7

BOOSTING CIRCUIT

CROSS REFERENCE TO RELATED APPLICATIONS

This application is a division of U.S. patent application entitled "BOOSTING CIRCUIT" Ser. No. 13/340,012, filed on Dec. 29, 2012, which claims priority of Japan Patent Application No. 2011-141328, filed on Jun. 27, 2011, the entirety of which are incorporated by reference herein.

BACKGROUND OF THE INVENTION

1. Field of the Invention

The disclosure relates generally to a boosting method, and more particularly relates to a boosting circuit of a semiconductor device memory such as a semiconductor memory which requires a high voltage.

2. Description of the Related Art

Along with the miniaturization of the semiconductor design, the required operation voltage for driving semiconductor elements has decreased, and the required power voltage provided to the semiconductor device has decreased accordingly. For example, the power voltage provided from an external device to a semiconductor memory, has decreased from 3.3-2.5V to 1.8V. Also, the inner circuit of a semiconductor memory usually requires, multiple power voltages, for example, the voltage for driving the transistor or the voltage applied to the wells, etc., so that it requires a high voltage higher than the power voltage. Thus, the semiconductor device requires a boosting circuit to boost the supply voltage supplied from the external device to a desired voltage. This boosting circuit is typically formed by a charge pump circuit.

As show in FIG. 1, Patent Document 1 discloses two pump circuits connected in series constituting a boosting circuit which may boost the power voltage to a value that is more than twice as high as before. This boosting circuit is applied to an inner circuit of a dynamic memory, and transforms the power voltage VDD into a higher voltage Vpp which is applied to a word line. The boosting circuit comprises an inverter INV, capacitors C1, C2, and switches SW1, SW2. As shown in FIG. 1a, when the switches SW1, SW2 are turned off, the negative electrode of the capacitor C1 is connected with the ground, the capacitor C1 accumulates the charges corresponding to the power supply VDD, and the capacitor C2 also accumulates the charges corresponding to the power supply VDD.

When the driving voltage Vpp is applied to a word line of a DRAM, the switches SW1, SW2 are turned on, and the electrode of the capacitor C1 is boosted to 2*VDD from VDD and the electrode of the capacitor C2 is boosted to 3*VDD and the boosting voltage Vpp is applied to the word line.

Also, considering that the timing of operating the boosting circuit in the semiconductor device and the timing of the boosting voltage being consumed does not match, and it is difficult to speed up the boosting speed of the charge pump circuit, so that it usually makes a plurality of the boosting circuits distributed to work. Patent Document 2 has disclosed a boosting circuit is capable to consume a matching timing to obtain a better efficiently.

PRIOR ART DOCUMENTS

[Patent Document 1] Japan Patent Application No. 2005-235315

[Patent Document 2] Japan Patent Application No. 2001-250381

BRIEF SUMMARY OF THE INVENTION

The Problem to be Solved

FIG. 2 is a structure diagram illustrating an embodiment of a conventional boosting circuit which is formed by the pump circuits connected in series. The boosting circuits boost the power voltage Vdd provided from external device, and output a boosting voltage which is three times that of the power voltage Vdd.

The output circuit comprises an output terminal OUT. The clock signal CLK is at low voltage level during the pre-charging operation, and the boosting node boost-1 is pre-charged into a voltage with Vdd by the P-type pre-charging transistor Pre1. Next, the clock signal CLK is transformed into a high voltage level, the transmission control signal Kickb is transformed into a low voltage level, and the charges stored in the boosting node boost-1 is transmitted to the output node Kick by the P-type transmission transistor TP2. When starting transmission after a delayed period by the inverters IN2, IN3, the pre-charging transistor Pre1 is turned off.

The boosting node boost-1 is coupled to the middle pump circuit which comprises a capacitance unit C1. The pump circuit and the output circuit have the same structure, but the middle pump circuit, is provided a clock signal which lags behind that of the clock signal CLK by the inverters IN4, IN5, IN6. Similar to the output circuit, the charges pre-charged in the boosting node boost-2 are transmitted by the transmission transistor TP5 to the output node Kick-1. Thus, the capacitive coupling boosting node boost-1 is boosted.

In addition, the boosting node boost-2 is coupled to the front pump circuit which comprises a capacitance unit C3. The front pump circuit comprises a transmission transistor TP7 transmitting power voltage Vdd to the output node Kick-2, and the transmission transistors TP7. TN7 are provided a clock signal which lags behind that of the clock signal CLK by the inverters IN4, IN5, IN9, IN10, IN11. When the output node Kick-2 is boosted to voltage Vdd, the capacitive coupled boosting node boost-2 is boosted to 2*Vdd. Finally, the output node Kick of the output circuit generates a boosting voltage with 3*Vdd.

This boosting circuit has an advantage of generating the boosting voltage synchronizing with the clock signal CLK. However, if the frequency becomes higher in order to speed up the operation of the boosting circuit, the charges of the boosting nodes boost-1, boost-2 may be transmitted to the output node Kick before the boosting nodes boost-1, boost-2 are pre-charged into the voltage Vdd. Thus, the output OUT may not reach the voltage with 3*Vdd (<3*Vdd).

Solutions of the Problem

The purpose of the invention is to solve the above conventional problems, and to provide a boosting circuit which generates a right boosting voltage.

Also further, the purpose of the invention is to monitor the output node which is boosted, and to provide a simpler structure of the boosting circuit, which steadily generates a boosting voltage.

An embodiment of a boosting circuit, comprises: an output circuit, comprising: a first transmission circuit, transmitting charges accumulated in a first boosting node to a first output node according to a first transmission control signal, wherein the first transmission control signal is applied to control the transmission of charges; a first detection circuit, detecting a voltage level of the first output node; and a first pre-charge circuit, pre-charging the first boosting node according to a first detection signal of the first detection circuit; a first pump circuit, comprising: a second transmission circuit, transmitting charges to a second output node according to a second transmission control signal, wherein the second transmission control signal is applied to control the transmission of charges; and a first capacitance unit, coupled to the first boosting node, boosting a voltage level of the first boosting node according to the charges transmitted into the second output node; and a control circuit, coupled to the output circuit and the first pump circuit, and controlling the second transmission control signal according to the voltage of the first output node.

An embodiment of a boosting circuit, comprises: an output circuit, comprising: a first transmission circuit, transmitting charges accumulated in a first boosting node to a first output node according to a first transmission control signal, wherein the first transmission control signal is applied to control the transmission of charges; a first detection circuit, detecting a voltage level of the first output node; and a first pre-charge circuit, pre-charging the first boosting node according to a first detection signal of the first detection circuit; a first pump circuit, comprising: a second transmission circuit, transmitting charges to a second output node according to a second transmission control signal, wherein the second transmission control signal is applied to control the transmission of charges; and a first capacitance unit, coupled to the first boosting node, boosting a voltage level of the first boosting node according to the charges transmitted into the second output node, wherein the second transmission control signal is coupled to the first detection signal.

A preferred embodiment of a boosting circuit is provided, wherein the first pump circuit further comprises: a second detection circuit, detecting a voltage level of the second output node; and a second pre-charge circuit, pre-charging the second boosting node according to a second detection signal of the second detection circuit. A preferred embodiment of a boosting circuit, further comprises: a second pump circuit, comprising: a third transmission circuit, transmitting charges into a third output node according to a third transmission control signal, wherein the third transmission control signal is applied to control the transmission of charges; and a second capacitance unit, coupled to the second boosting node, boosting the voltage level of the second boosting node according to the charges transmitted into the third output node, wherein the control circuit further controls the third transmission control signal according to the voltage level of the second output node. A preferred embodiment of a boosting circuit is provided, wherein when the first output node exceeds a threshold value, the first pre-charging circuit stops pre-charging the first boosting node, and the second transmission circuit transmits the charges accumulated in the second output node to the second output node for boosting the voltage level of the first boosting node. A preferred embodiment of a boosting circuit is provided, wherein when the second output node exceeds the threshold value, the second pre-charging circuit stops pre-charging the second boosting node, and the third transmission circuit transmits the charges to the third output node and boosts the voltage level of the second boosting node. A preferred embodiment of a boosting circuit further comprises a plurality of additional first pump circuits having the same circuitry as the first pump circuit, wherein the additional first pump circuits and the first pump circuits are coupled in series.

EFFECTS OF THE INVENTION

The invention utilizes control of the pre-charging of the boost node according to the voltage of output node, to avoid an insufficient voltage level of the boost node or the output node when boosting the capacitance. Thus, the predetermined boost voltage is accomplished.

BRIEF DESCRIPTION OF DRAWINGS

FIGS. 1a and 1b are structure diagrams illustrating an embodiment of a conventional pump circuit;

FIG. 6 is a status list illustrating the nodes or signals of an embodiment of the boosting circuit;

FIG. 7 is a status list illustrating the nodes or signals of a conventional boosting circuit;

DETAILED DESCRIPTION OF THE INVENTION

Structures for Embodiments of the Invention

The embodiment of the invention will become more fully understood by referring to the following detailed description with reference to the accompanying drawings.

Embodiments

Figure 2:
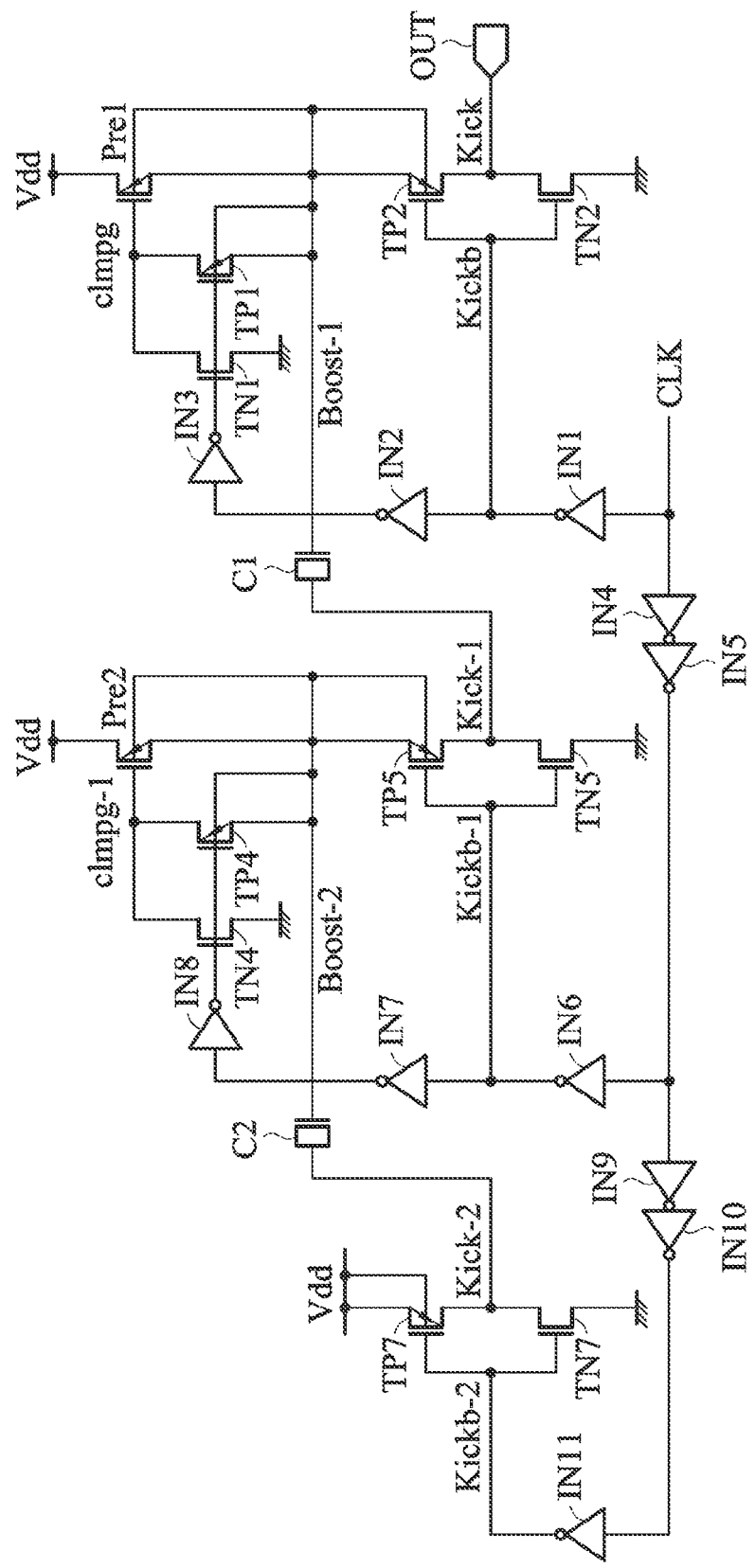
FIG. 2 is a structure diagram illustrating an embodiment of a conventional boosting circuit.
Figure 3:
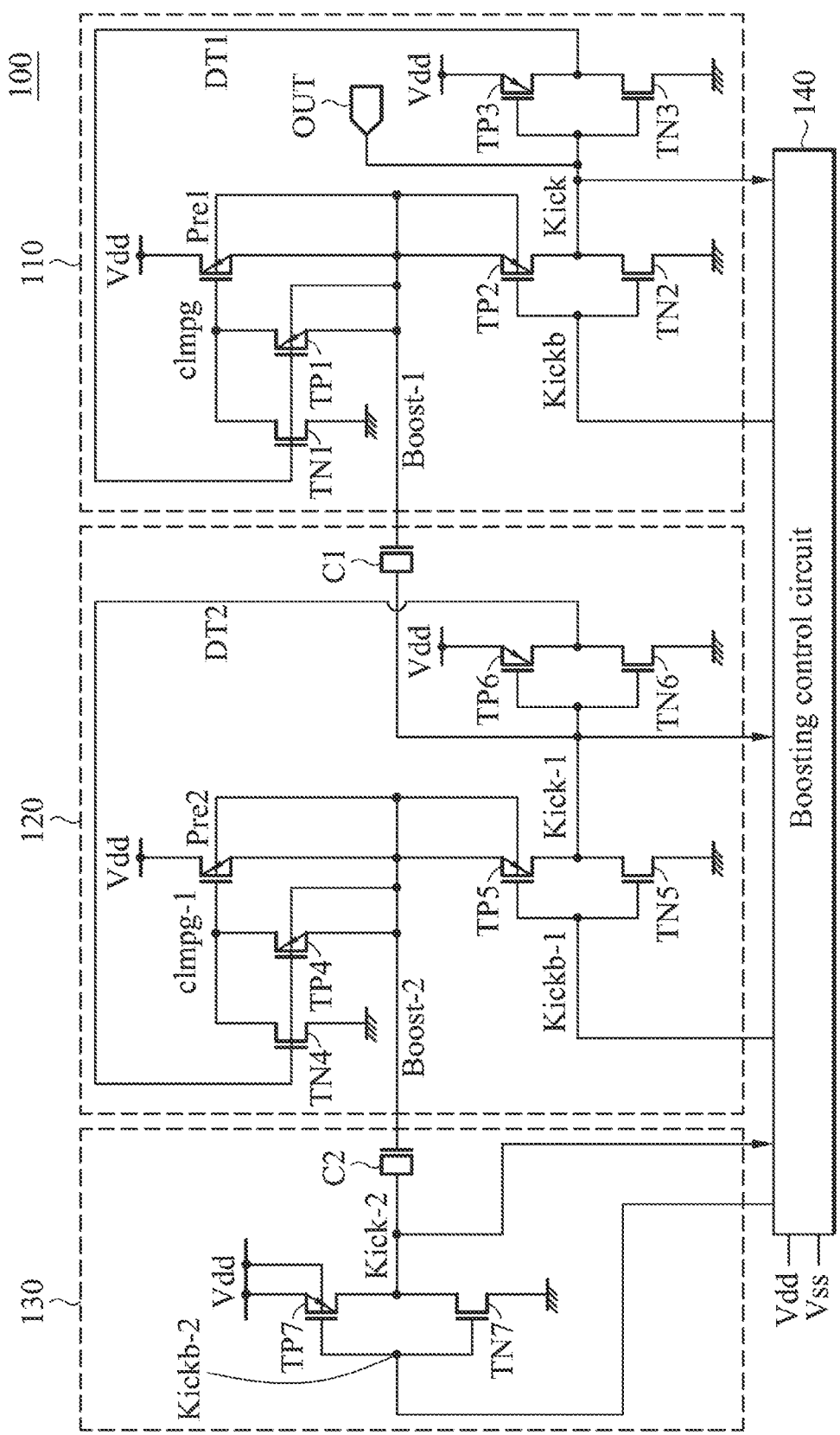
FIG. 3 is a structure diagram illustrating an embodiment of a boosting circuit device.

FIG. 3 is a structure diagram illustrating an embodiment of a boosting circuit device. The boosting circuit 100 of the embodiment comprises an output circuit 110, a first pump circuit 120, a second pump circuit 130 and a boosting control circuit 140. Also, the same elements as the prior device shown in FIG. 2 are marked with the same reference signs.

The output circuit 110 comprises a pre-charge circuit for pre-charging a boost node boost-1, a transmission circuit for transmitting the charges pre-charged in the boost node boost-1 to an output node Kick (OUT), and a detection circuit for detecting the voltage of the output node Kick.

The pre-charge circuit has a P-type pre-charge transistor Pre1 coupled to a power voltage Vdd, and an N-type transistor TN1 and a P-type transistor TP1 both coupled to the gate of the P-type pre-charge transistor Pre1, wherein the gate of the transistor TN1 and the gate of the transistor TP1 are both coupled to a detection signal DT1 of the detection circuit.

The transmission circuit comprises a CMOS inverter composed by a P-type transistor TP2 and an N-type transistor TN2, and the input of the transmission circuit is coupled to the control signal Kickb transmitted by the boosting control circuit 140. The output node Kick of the transmission circuit is coupled to the output OUT, the boosting control circuit 140 and a detection circuit together. The detection circuit comprises a CMOS inverter composed by a P-type transistor TP3 and an N-type transistor TN3, wherein the input of the detection circuit is coupled to the output node Kick, and the detection circuit provides a detection signal DT1 to the pre-charge circuit according to the output node Kick.

The output circuit 110 and the first pump circuit 120 are connected in series. The first pump circuit 120 comprises a pre-charge circuit (Pre2, TN4, TP4), a transmission circuit (TP5, TN5), a detection circuit (TP6, TN6), as similar to the output circuit 110. The first pump circuit 120 further comprises a capacitance unit C1 capacitive coupling to the boosting node boost-1 of the output circuit 110. The output node Kick-1 of the transmission circuit of the first pump circuit 120 is coupled to the capacitance unit C1, and the detection and the boosting control circuit 140. In addition, the transmission control signal kickb-1 of the first pump circuit 120 with a high voltage level or a low voltage level is based on the output node Kick, as recited in the following description.

The second pump circuit 130 is formed as a pump circuit of the front stage, and differs from the first pump circuit 120, and the second pump circuit 130 has no pre-charge circuit. In other words, the second pump circuit 130 comprises a transmission circuit (TP7, TN7) transmitting the charges from power Vdd to the output node Kick-2, and a capacitance unit C2 capacitive coupling to the boosting node boost-2 of the first pump circuit 120, wherein the output node Kick-2 is coupled to the capacitance unit C2 and the boosting control circuit 140. In addition, the transmission control signal kickb-2 of the second pump circuit 130 with a high voltage level or a low voltage level is based on the status of the output node Kick-1.

The embodiment of the boosting circuit 100 has a composition as FIG. 3 for substantially tripling the power voltage Vdd into a boosting voltage (3*Vdd), however the composition may change the magnitude of the boosting voltage, as the following describes. For example, in the case of applying more pump circuits to generate a larger boosting voltage, more first pump circuits may be connected in series. For the instance of generating a boosting voltage with 4*Vdd, two first pump circuits 120 may be connected in series. For the instance, of generating a boosting voltage with 5*Vdd, three first pump circuits 120 may be connected in series.

The boosting control circuit 140 is coupled to the output circuit 110, the first pump circuit 120 and the second pump circuit 130. The boosting control circuit 140 generates the transmission control signal Kickb-1 to enable the transmission circuit according to the output node Kick, generates the transmission control signal Kickb-2 to enable the transmission circuit according to the output node Kick-1, and generates the transmission control signals Kickb, Kickb-1 and Kickb-2 to disable the transmission circuit according to the output node Kick-2.

Figure 4:
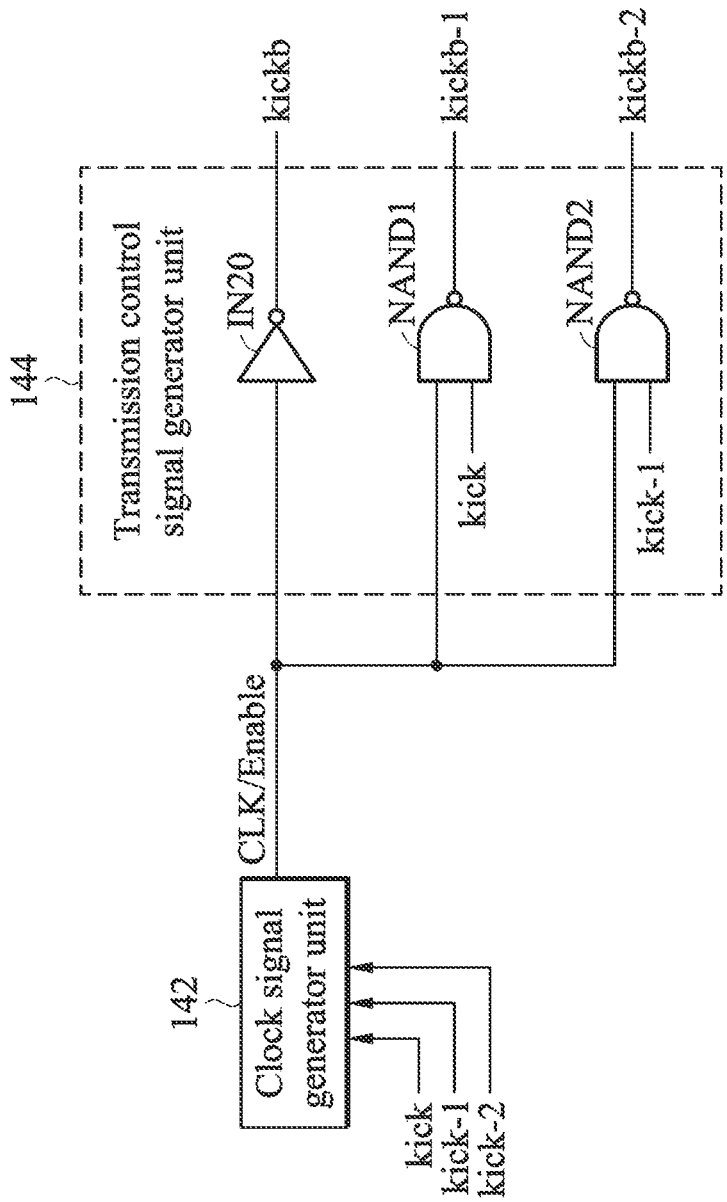
FIG. 4 is a structure diagram illustrating an embodiment of the boosting control circuit of FIG. 3.

FIG. 4 is a structure diagram illustrating an embodiment of the boosting control circuit 140. The boosting control circuit 140 has a clock signal generator unit 142 generating the clock signal CLK or the enable signal Enable (both are referred to as clock signal CLK in the following description) according to the output nodes Kick, Kick-1 and Kick-2, and a transmission control signal generator unit 144 generating the transmission control signals Kickb, Kickb-1 and Kickb-2 according to the clock signal CLK. The power voltage Vdd is provided to the clock signal generator unit 142 and the transmission control signal generator unit 144.

The transmission control signal generator unit 144 has an inverter IN20, NAND gate NAND1 and NAND gate NAND2 all coupled to the clock signal CLK. The inverter IN20 delays the clock signal CLK for a period, and generates the transmission control signals Kickb with the anti-phase to the clock signal CLK. The inverter IN20 may be constituted by one or more inverters connected in series. The NAND gate NAND1 is inputted with the clock signal CLK and the output node Kick, and the output of the NAND gate NAND1 generates the transmission control signals Kickb-1. The NAND gate NAND2 is inputted with the clock signal CLK and the output node Kick-1, and the output of the NAND gate NAND2 generates the transmission control signals Kickb-2. In addition, when the output node Kick-2 of the clock signal generator unit 142 has Vdd voltage level, the clock signal CLK is generated with a high voltage level.

Figure 5:
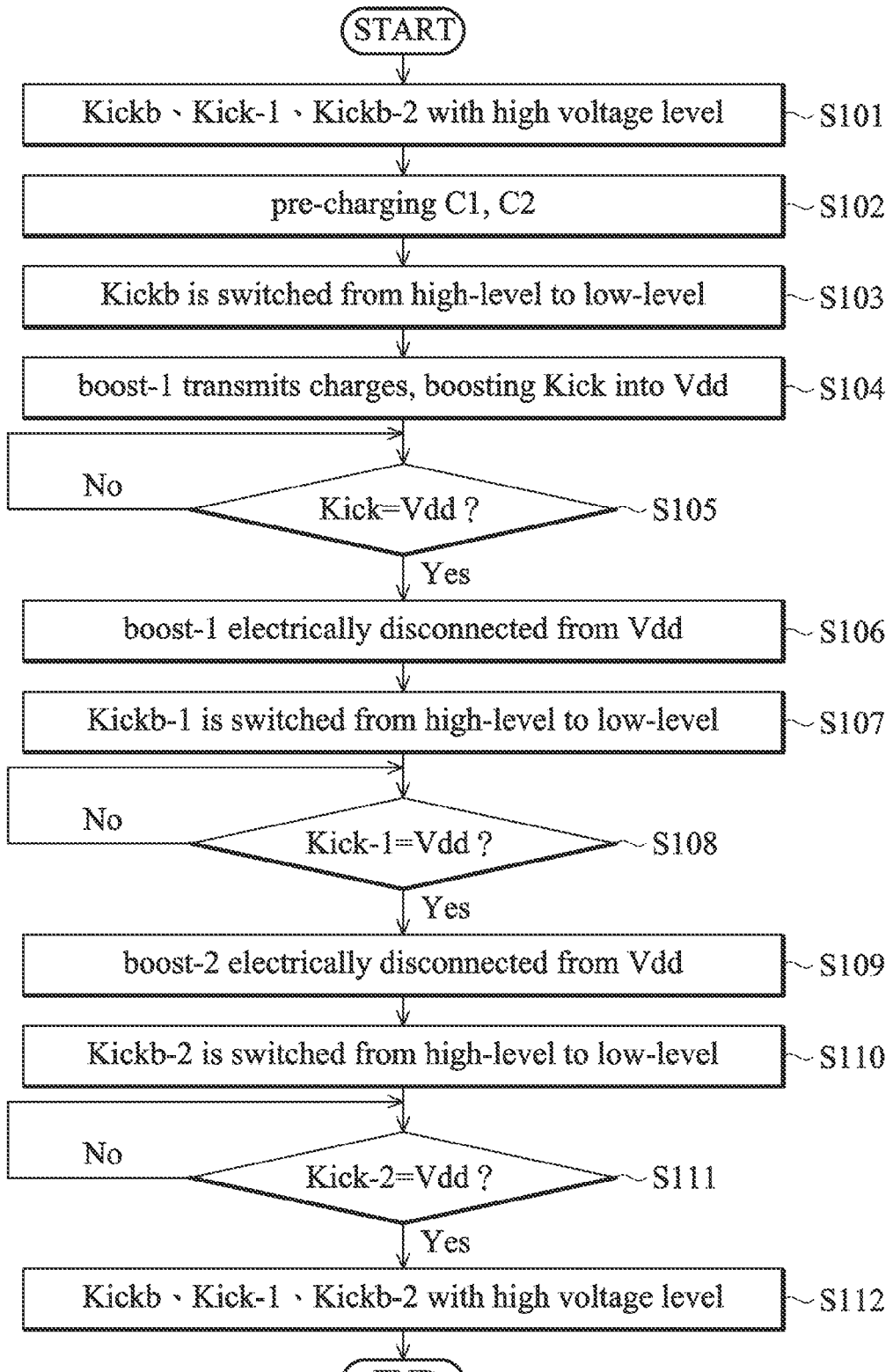
FIG. 5 is a flowchart illustrating the operations of an embodiment of the boosting circuit.
Figure 8:
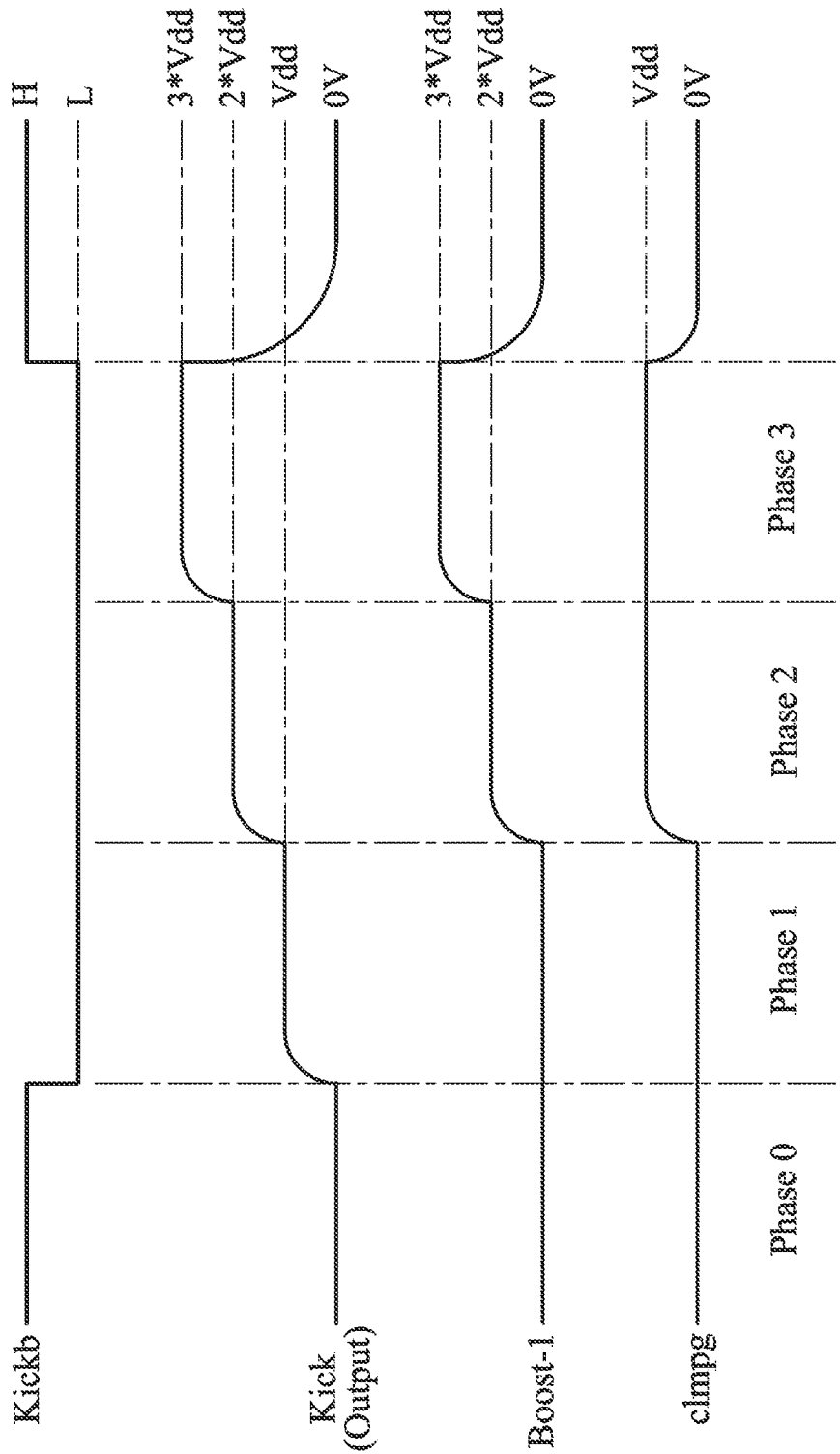
FIG. 8 is waveform diagrams illustrating the nodes or signals of an embodiment of the boosting circuit.
Figure 9:
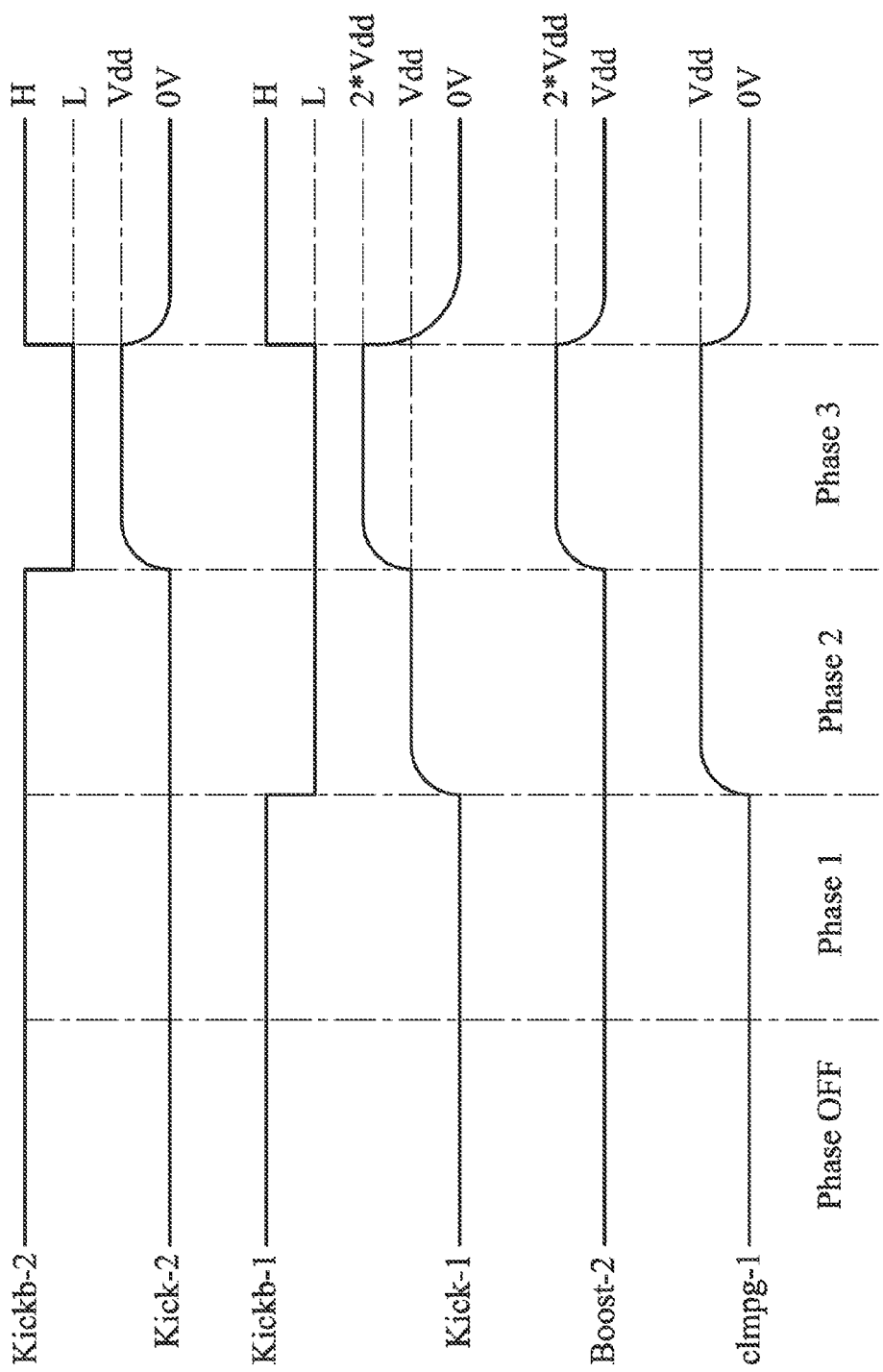
FIG. 9 is waveform diagrams illustrating the nodes or signals of an embodiment of the boosting circuit.

The operation of the embodiment of the boosting circuit is illustrated in the following description. FIG. 5 is a flowchart illustrating the operation of the boosting circuit, FIG. 6 is a status list illustrating the nodes or signals of the boosting circuit, FIG. 8 and FIG. 9 are waveform diagrams illustrating the nodes or signals of the boosting circuit. FIG. 6 shows operations of the boosting circuit in the phase Off, phase 1, phase 2 and phase 3 during a period.

At the start of the boosting operation, namely in the phase off, the transmission control signals Kickb, Kickb-1, Kickb-2 at the input of the boosting are at high voltage levels. This means that the clock signal generator unit 142 outputs the clock signal CLK with a low voltage level. Accordingly, the output nodes Kick, Kick-1, Kick-2 have the voltage with 0V or GND (ground). The detection signals DT1, DT2 thus, are transformed to high voltage levels. The nodes clmpg, clmpg-1 thus, are transformed to low voltage levels. The pre-charge transistors Pre1, Pre2 are turned off. The electrodes of one side of the capacitance units C1, C2 are GNDs. The electrodes of another side of the capacitance units C1, C2, namely the boosting nodes boost-1, boost-2, are precharged by the power voltage Vdd and are transformed to the voltage level of Vdd (Step S101, S102).

In phase 1, the transmission control signal Kickb is switched from a high voltage level to a low voltage level (Step S103). This means that the clock signal generator unit 142 outputs the clock signal CLK with a high voltage level. Meanwhile, the nodes Kick, Kick-1 of the inputs of the NAND gates NAND1, NAND2 have low voltage levels, so that the NAND gates NAND1, NAND2 are disabled, and the transmission control signals Kickb-1, Kickb-2 are at high voltage levels. The time span of switching the transmission control signal Kickb from a high voltage level to a low voltage level is set to the time span of the capacitance units C1, C2 being sufficiently charged.

Due to the transmission control signal Kickb being switched to a low level voltage, the transistor TP2 of the transmission circuit of the output circuit 110 turns on, and the charges of the boosting node boost-1 are transmitted to the output node Kick, and the output node Kick is boosted to Vdd (Step S104). Meanwhile, the pre-charge transistor Pre1 is still turned on, so that the boosting node boost-1 keeps the voltage at Vdd. The detection circuit determines whether the output node Kick has reached the threshold voltage Vth (Step S105). If the output node Kick has reached the threshold voltage Vth, the detection signal DT1 is transformed into a low level voltage, and the node clmpg is transformed into high level voltage, and the pre-charge transistor Pre1 is turned off. Accordingly, the boosting node boost-1 becomes electrically disconnected from the power Vdd (Step S106).

The beginning of the phase 2 corresponds to the output node Kick being boosted to voltage Vdd. This means that when the output node Kick is boosted to voltage Vdd, the NAND gate NAND1 is enabled and outputs the transmission control signal Kickb-1 with a low voltage level from the output of the NAND gate NAND1 (Step S107). Accordingly, the transistor TP5 of the transmission circuit of the first pump circuit 120 turns on, and the charges of the boosting node boost-2 is transmitted to the output node Kick-1, and the output node Kick-1 is boosted to voltage Vdd. Meanwhile, due to the pre-charge transistor Pre2 still being turned on, the boosting node boost-2 is not lower than the voltage Vdd. The detection circuit determines whether the output node has reached the threshold voltage Vth (voltage Vdd) (Step S108). If the output node Kick-1 has reached the voltage Vdd, the detection signal DT2 transformed into a low level voltage, and the pre-charge transistor Pre2 is turned off. Accordingly, the boosting node boost-2 becomes electrically disconnected with the power Vdd (Step S109). In addition, due to the output node Kick-1 being boosted to voltage Vdd, the boosting node boost-1 is boosted to voltage Vdd*2.

The beginning of the phase 3 corresponds to the output node Kick-1 being boosted to voltage Vdd. This means that when the output node Kick-1 is boosted to voltage Vdd, the NAND gate NAND2 is enabled and outputs the transmission control signal Kickb-2 with a low voltage level from the output of the NAND gate NAND2 (Step S109). Accordingly, the transistor TP7 of the transmission circuit of the second pump circuit 130 turns on, and the charges of the power Vdd is transmitted to the output node Kick-2, and the output node Kick-2 is boosted to voltage Vdd. Due to the output node Kick-2 being boosted to voltage Vdd, the boosting node boost-2 is boosted to voltage Vdd*2, and due to the boosting node boost-2 being boosted to voltage Vdd*2, the boosting node boost-1 is boosted to voltage Vdd*3.

The end of the phase 3 corresponds to the output node Kick-2 being boosted to voltage Vdd. This means that when "Kick-2=Vdd" is detected by the clock signal generator unit 142 (Step S111), the clock signal CLK is transformed into a low voltage level from high voltage level, and is phase off. Accordingly, the transmission control signals Kickb, Kickb-1, Kickb-2 all transform into high voltage levels.

FIG. 7 is a status list illustrating the nodes or signals of a comparative embodiment of the conventional boosting circuit as shown in FIG. 2. Regarding the conventional boosting circuit, the transmission control signals Kickb, Kickb-1, Kickb-2 are the signals which lag behind the clock signal CLK for a time span. The pre-charge transistors Pre1, Pre2 charge the boosting nodes boost-1, boost-2 according to a charging period, and the charging period is determined by the inverters IN2, IN3, IN7, IN8 lagging the clock signal CLK. As a result, while the charging period is short, the transmission transistors TP2, TP6 turn on before the boosting nodes boost-1, boost-2 are boosted to voltage Vdd, such that the final output OUT may not reach the desired voltage. Also, before the output node Kick has reached the voltage Vdd, the boosting node boost-1 based on the output node Kick-1 of the rear stage may not reach the desired voltage. As shown in FIG. 7, while the output node Kick is boosted to voltage 0.8*Vdd or the boosting node boost-1 is boosted to voltage 0.8*Vdd, the final output OUT only has voltage 3*(0.8*Vdd), In contrast, the boosting circuit of the invention keeps operating the pre-charge circuits until the boosting node boost-1 and the output node Kick are boosted to voltage Vdd, such that the boosting node boost-1 and the output node Kick are prevented from not reaching voltage Vdd. Thus, the final output OUT would reach the desired voltage.

Figure 10:
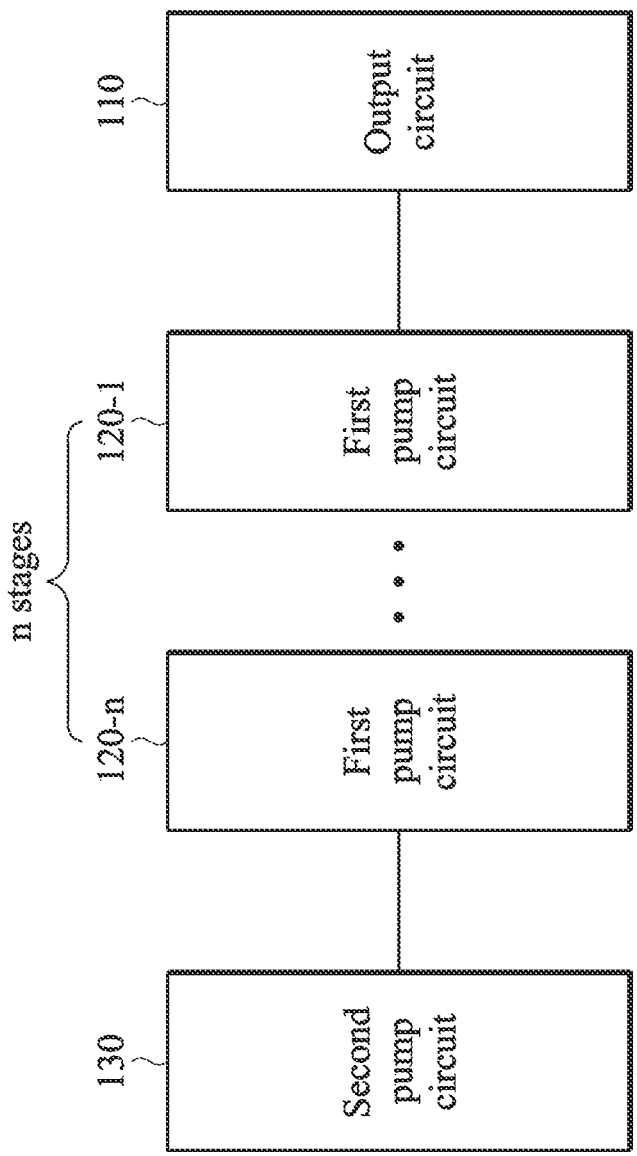
FIG. 10 is a structure diagram illustrating another embodiment of a boosting circuit device.

FIG. 10 is a structure diagram illustrating another embodiment of a boosting circuit device, in addition to the first embodiment. Although the boosting circuit 100 of FIG. 3 has a first pump circuit 120 and a second pump circuit 130, in order to obtain the desired voltage, it might use n (n is a natural number) stages of first pump circuits 120-1, 120-2, 120-n connected in series.

Figure 11:
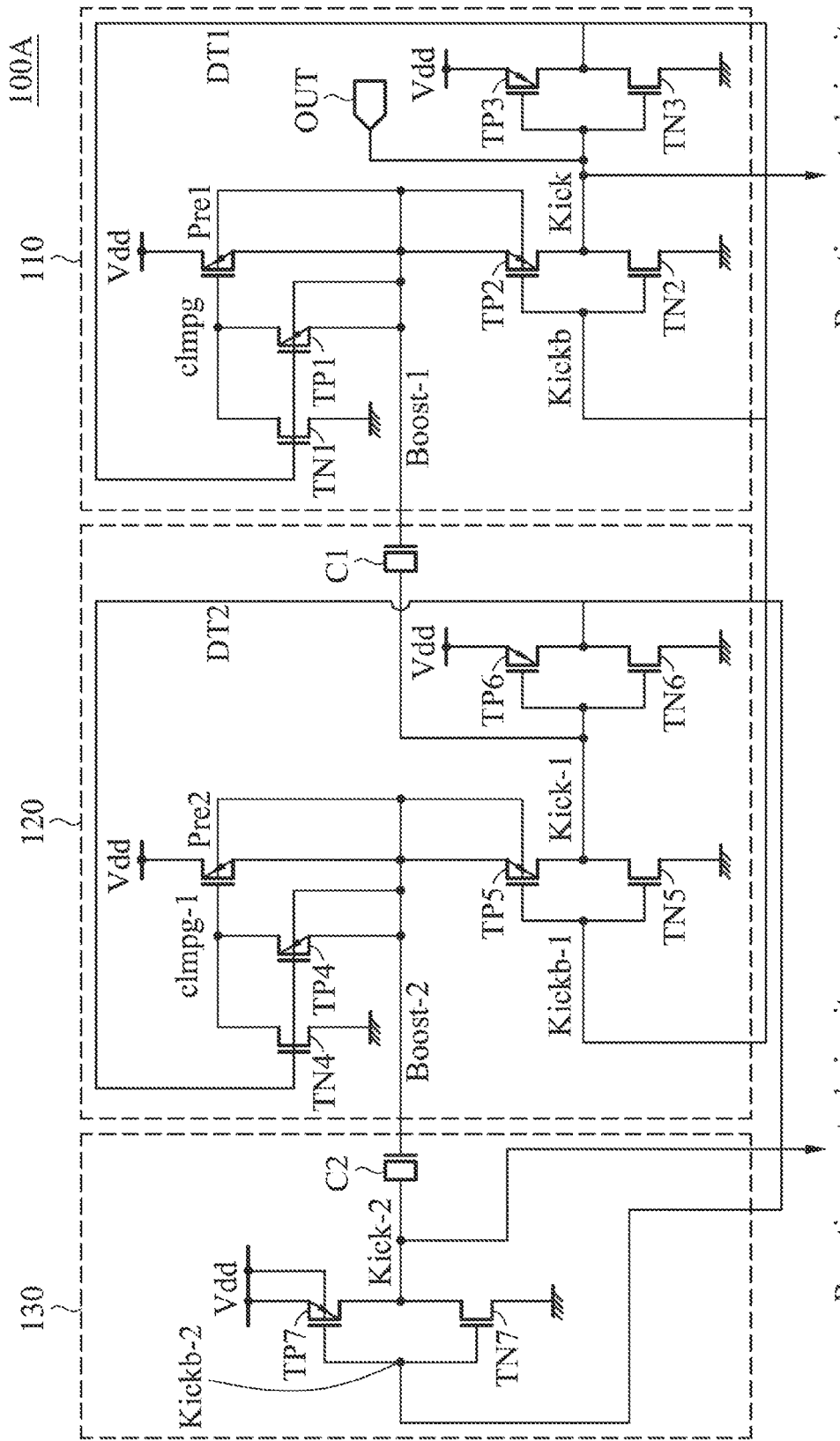
FIG. 11 is a structure diagram illustrating the second embodiment of a boosting circuit device.

The second embodiment of the invention is illustrated in the following description. In the first embodiment of the boosting circuit, as an example, the transmission control signal provided to the front stage is controlled according to the voltage level of the output node of the rear stage. However, in the second embodiment of the boosting circuit as shown in FIG. 11, the detection signal DT1 of the output circuit 110 is applied to transmit the transmission signal Kickb-1, and the detection signal DT2 of the first pump circuit 130 is applied to transmit the transmission signal Kickb-2. Thus, the structure of the boosting circuit 140 may be simplified. Note that the same arrangement in FIG. 11 and FIG. 3 are marked with the same reference signs for abridging the description.

While the invention has been described by way of example and in terms of preferred embodiment, it is to be understood that the invention is not limited thereto. Therefore, the scope of the present invention shall be defined and protected by the following claims and their equivalents.

The embodiment of the boosting circuit described above, although outputting the boosted voltage to the charging pump circuit, for example, the output (OUT) of the boosting circuit may also utilize the clock which is applied in operation of the other charging pump circuit. Note that the boosting circuit shown in FIG. 3 only shows a preferred embodiment, and the invention is not limited to the same circuit as FIG. 3, and the circuits which may perform the same process as FIG. 5 may be included. Further, the boosting circuit of the invention is preferred to be applied in a semiconductor device which requires power provided from an external device, such as a flash memory.

What is claimed is:

1. A boosting circuit, comprising:
   an output circuit, comprising:
      a first transmission circuit, transmitting charges accumulated in a first boosting node to a first output node according to a first transmission control signal, wherein the first transmission control signal is applied to control the transmission of charges;
      a first detection circuit, comprising an inverter, detecting a voltage level of the first output node, wherein the inverter further comprises:
         a P-type transistor having a first source terminal coupled to a supply voltage, a first gate terminal coupled to the first output node, and a first drain terminal outputting the first detection signal; and
         an N-type transistor having a second source terminal coupled to a ground, a second gate terminal coupled to the first gate terminal, and a second drain terminal coupled to the first drain terminal; and
      a first pre-charge circuit, pre-charging the first boosting node according to a first detection signal of the first detection circuit;
   a first pump circuit, comprising:
      a second transmission circuit, transmitting charges to a second output node according to a second transmission control signal, wherein the second transmission control signal is applied to control the transmission of charges; and
      a first capacitance unit, coupled to the first boosting node, boosting a voltage level of the first boosting node according to the charges transmitted into the second output node,
   wherein the second transmission control signal is coupled to the first detection signal.

2. The boosting circuit of claim 1, wherein the first pump circuit further comprises:
   a second detection circuit, detecting a voltage level of the second output node; and
   a second pre-charge circuit, pre-charging the second boosting node according to a second detection signal of the second detection circuit.

3. The boosting circuit of claim 2, further comprising:
a second pump circuit, comprising:
- a third transmission circuit, transmitting charges into a third output node according to a third transmission control signal, wherein the third transmission control signal is applied to control the transmission of charges; and
- a second capacitance unit, coupled to the second boosting node, boosting the voltage level of the second boosting node according to the charges transmitted into the third output node,
wherein the third transmission control signal is controlled according to the voltage level of the second output node.

4. The boosting circuit of claim 3, wherein when the first output node exceeds a threshold value, the first pre-charging circuit stops pre-charging the first boosting node, and the second transmission circuit transmits the charges accumulated in the second boosting node to the second output node for boosting the voltage level of the first boosting node.

5. The boosting circuit of claim 4, wherein when the second output node exceeds the threshold value, the second pre-charging circuit stops pre-charging the second boosting node, and the third transmission circuit transmits the charges to the third output node and boosts the voltage level of the second boosting node.

6. The boosting circuit of claim 1, further comprising a plurality of additional first pump circuits having the same circuitry as the first pump circuit, wherein the additional first pump circuits and the first pump circuit are coupled in series.

\* \* \* \* \*